June 11, 1963 R. R. HABERECHT ETAL 3,093,755

SEMICONDUCTOR DIODE EXHIBITING DIFFERENTIAL NEGATIVE RESISTANCE

Filed July 7, 1960

INVENTORS
ROLF R. HABERECHT
WALLACE D. LOFTUS
BY Nicholas Lango
ATTORNEY

United States Patent Office 3,093,755

Patented June 11, 1963

3,093,755

SEMICONDUCTOR DIODE EXHIBITING DIFFERENTIAL NEGATIVE RESISTANCE

Rolf Reinhold Haberecht and Wallace D. Loftus, Indianapolis, Ind., assignors to P. R. Mallory & Co., Inc., Indianapolis, Ind., a corporation of Delaware Filed July 7, 1960, Ser. No. 41,415
7 Claims. (Cl. 307—88.5)

This invention pertains to semiconductor devices, and particularly to a semiconductor diode which is capable of switching from a high forward resistance state to a low resistance state when the voltage applied thereto reaches a predetermined level, the voltage across the diode then regeneratively dropping to a relatively low level.

A well known characteristic of the ordinary reverse-biased PN junction diode is that its resistance drops at an increasing rate as the voltage applied thereto approaches a particular breakdown level. This is known as the avalanche current multplication effect, and is attributed to the fact that an increasing proportion of the minority carriers reaching the barrier region in the vicinity of the junction of the P and N zones then attain sufficient energy to ionize formerly neutral atoms in that region. Additional hole-electron pairs are thus generated, and contribute to the total current flow. The barrier potential and the avalanche effect both increase with the applied voltage, until finally at the breakdown voltage level a self-sustaining condition is reached wherein the current tends to continue to rise independently of any further increase in voltage. The incremental resistance of the diode is then extremely low. However, continued maintenance of this operating condition requires that the voltage across the diode remain at least at the breakdown level. This type of operating characteristic is therefore unsuited to applications where it is necessary to switch from a high resistance to a low resistance state in response to a momentary signal, and to then remain in the new state even though the voltage drops back to a level considerably lower than that at which the switching operation occurred. In such situations resort has therefore had to be made to more complicated three-terminal devices such as transistors, leading to considerably more complicated associated circuitry.

Various attempts have heretofore been made to devise a commercially practical semiconductor diode capable of switching to and remaining in a low resistance state in response to a momentary switching voltage exceeding a particular critical level. One type of diode aimed at that objective includes four successive semiconductive zones of alternate type conductivity, such as PNPN. Voltage is applied across all zones in a direction which forward-biases the two outer junctions and reverse-biases the central junction. Avalanche current multiplication at the central junction causes the current conducted thereat and the current gain factors applicable to each of the other two junctions to increase as the voltage increases. The total current gain thus finally becomes capable of supporting a further increase in current independently of any further increase in the avalanche multiplication effect. The latter therefore drops while the current and the current gain factors continue to rise, causing the diode to undergo a regenerative transition to a much lower resistance state with a considerable reduction in the voltage drop there-across. Unfortunately, the voltage required to produce this transition is relatively high, commonly being in excess of 30 volts. The four-zone structure is also rather expensive to manufacture. Attempts have been made to achieve a somewhat similar operating characteristic with a three-zone diode structure by employing a collector junction of much smaller lateral extent than the emitter junction, and sometimes also with a graded increase in the ohmic resistance of the central zone in the lateral direction. Such techniques inevitably lead to complicated and expensive manufacturing operations. In addition, the voltage required to maintain the low resistance operating state has had to be a relatively high proportion of the voltage at which switching to that state occurs.

Accordingly, an object of the present invention is to provide a semiconductor, diode of simple and economical construction, capable of switching from a high forward resistance state to a low forward resistance state when the voltage applied thereto reaches a predetermined level, the voltage across the diode then falling to a substantially lower level.

A further object is to provide such a semiconductor diode wherein the switching voltage may be set at a desired value which may lie in the range below ten volts.

A further object is to provide such a semiconductor diode wherein the voltage there-across in the low resistance state is only a small proportion of the voltage at which switching occurs.

A still further object is to provide a three-zone semiconductor diode structure wherein switching from a high to a low forward resistance state is effected by a regenerative increase in the minority carrier concentration in the central zone thereof after the voltage applied across the diode attains a predetermined switching level.

Pursuant to the foregoing objects, a semiconductor diode in accordance with the invenion may comprise a uniary structure of three successive semiconductive zones which form an emitter junction between the first outer zone and one side of the central zone and a collector junction between the second outer zone and the other side of the central zone, the width of the second outer zone and the other side of the central zone, the width of the second outer zone being at most equal to the diffusion length therein of minority carriers from the central zone. The diode further comprises means for applying a voltage there-across which forward-biases the emitter junction and reverse-biases the collector junction so as to establish thereat a potential barrier region which extends completely across the second outer zone when the voltage reaches a predetermined switching level, the potential across the barrier region then regeneratively collapsing due to a regenerative increase in the concentration of minority carriers injected within the central zone by the emitter junction.

A more complete description of the invention is presented in the following specification and accompanying drawings, but it should be noted that the true scope of the invention is actually pointed out in the succeeding claims. In the drawings:

*General*

Figure 1:
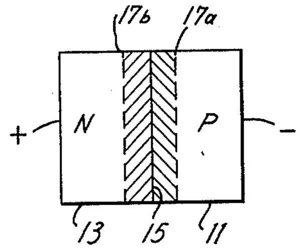
FIG. 1 is a diagram of a reverse-biased PN semiconductor junction.

Before considering applicant's diode, it will be helpful to first briefly note the salient characteristics of an ordinary reverse-biased PN semiconductor junction as shown in FIG. 1. Such a junction may be constructed by infusion of acceptor impurities to a desired depth into one end of an N type semiconductor crystal of garmanium or silicon, the degree of impurity infusion or "doping"

being sufficient to produce an excess hole density corresponding to a specified resistivity. This results in a P zone 11 wherein holes are the majority carriers. By also controlling the resistivity of the original N type crystal, a specified excess density of majority electrons is obtained in the N zone 13. At the junction 15 of the two zones a potential barrier must exist in order to maintain the excess concentration of positively charged holes on the P side and negatively charged electrons on the N side. This potential is therefore positive or at a higher level on the N side of the junction, and is supported by a corresponding carrier depletion region extending on each side of the junction as shown by the dotted lines 17*a* and 17*b*. Virtually no free electrons are present within the region from the junction 15 to the line 17*b*, and virtually no free holes are present within the region from the junction to line 17*a*. The depletion region therefore contains a negative charge due to the immobile ionized acceptor atoms on the P side thereof, and a positive charge due to the immobile ionized donor atoms on the N side.

If a potential V is applied across the junction in a direction which is positive at the N side, as illustrated, it will add to the contact difference in potential and so increase the total potential barrier. This causes the depletion region to widen, extendgng somewhat further into each zone. The degree of widening will depend on the majority carrier concentration, since if this is high a very slight increase in width will expose a great number of ions and so give rise to a large increase in space charge. Of course, the total charges on each side of the junction must balance each other. The barrier region will therefore extend proportionately further on the side of the junction of higher resistivity. It should also be noted that an increase in minority carrier concentration either side of the junction, as for example of holes in N zone 13, will result in a partial neutralization of the space charge and so reduce both the width and the potential across the barrier region. This fact is made use of in applicants' invention.

Although a reverse-bias voltage precludes conduction of majority carriers across the junction, it serves to accelerate passage of free minority carriers from each zone. That is, holes in the N zone and electrons in the P zone will freely cross over. Since a nominal concentration of such carriers is thermally produced in each zone, a very small reverse current kown as the saturation current $I_{co}$ will flow. The magnitude thereof is determined by the ambient temperature, and is independent of the applied voltage. However, as the voltage increases the total reverse current does increase due to the avalanche current multiplication effect noted above. The latter may be quantitatively expressed as a factor M corresponding to the ratio of the current due to carriers leaving the junction to that due to carriers reaching the junction, and is given by $$M=\frac{1}{1-(V/V_B)^n} \quad (1)$$

where V is the voltage across the junction, $V_B$ is the breakdown voltage, and $n$ is an empirical constant having a value of about 2.5 for silicon junctions and ranging up to about 5 for germanium junctions. The avalanche effect is thus considerably more pronounced in the case of silicon junctions. The breakdown voltage $V_B$ is the level at which the avalanche current multiplication becomes self-sustaining, the current then rising to a value limited only by the ohmic resistance of the semiconductor zones and the external circuit. Since the electric field across the barrier region at a given voltage level will be less for a greater barrier width, the value of $V_B$ increases with increasing resistivity of the zone into which the barrier region principally extends.

*Diode Construction*

Figure 2:
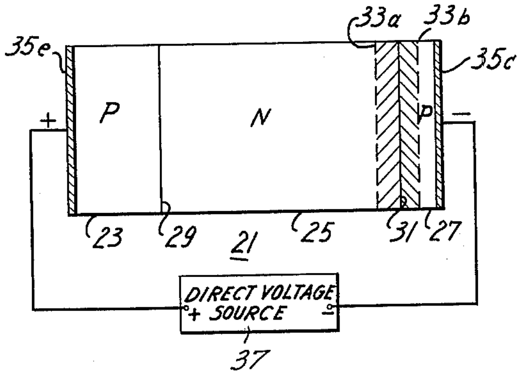
FIG. 2 is a diagram of a semiconductor diode constructed in accordance with the invention.

Turning now to FIG. 2, there is shown a diagram of a semiconductor diode constructed in accordance with applicants' invention. It comprises a unitary structure 21 of three successive semiconductive zones 23, 25 and 27 which form an emitter junction 29 between the first outer zone 23 and one side of the central zone 25 and a collector junction 31 between the second outer zone 27 and the other side of central zone 25, the width of zone 27 being at most equal to the diffusion length therein of minority carriers arriving from the central zone. Since formation of such junctions requires the successive zones to be of alternate type conductivity, the zones of structure 21 may either successively be NPN or, as illustrated, PNP. In the latter case the minority carriers referred to will be holes. It should be noted that the terms "emitter" and "collector" junction are convenient designations borrowed from transistor terminology to denote the fact that minority carriers are injected into the central zone at junction 29 and are removed therefrom at junction 31. The first outer zone 23 may therefore be referred to as the emitter, central zone 25 as the base, and second outer zone 27 as the collector of diode structure 21. Consistent therewith, the diode of FIG. 2 also comprises means for applying a voltage across structure 21 which forward-biases the emitter junction 29 and reverse-biases the collector junction 31 so as to establish thereat a potential barrier region 33*a*—33*b* which extends completely across collector zone 27 when that voltage reaches a predetermined switching level, the potential across the barrier region then regeneratively collapsing due to a regenerative increase in the concentration of minority carriers injected within base zone 25 by emitter junction 29. This refers to the fact that at the switching voltage level $V_s$ the line 33*b* denoting the extent of the potential barrier region into zone 27 will coincide with the boundary of that zone, thus precluding a further increase in barrier potential even though the voltage applied to the diode may tend to increase still more. Thus, the switching level $V_s$ may be far lower than the level at which the junction 31 would otherwise break-down due to avalanche current multiplication, as described above with reference to the reverse-biased PN junction in FIG. 1.

The means for applying the requisite voltage to diode structure 21 may simply comprise the pair of ohmic contact terminals 35*e* and 35*c* respectively welded to the ends of the emitter and collector zones 23 and 27. Such a voltage may be supplied from a direct voltage source 37 connected in series with contacts 35*e* and and 35*c* and poled so as to render terminal 35*e* positive. Source 37 should preferably have a relatively high internal resistance comparable to that of diode structure 21 in its high resistance state.

Structure 21 may be constructed either by fusion or diffusion (including grown junction techniques) of an acceptor impurity into each end of an N type semiconductor wafer in conventional manner. This, of course, refers to the illustrated PNP configuration since a donor impurity and a P type wafer would be utilized if an NPN configuration were desired. The zone widths may be controlled by the time and temperature of the diffusion or fusion process and the specific impurity employed. For example, acceptable results have been obtained with a diode constructed by diffusing boron into a silicon wafer of N type conductivity, the wafer being 18 mils htick and having a measured resistivity of 40 ohm-centimeters. The diffusion temperature was held at 1280° C. for 18 hours, resulting in formation of two uniform P type zones approximately 2.0 mils thick at each end of the wafer. One of these, which was to be the collector zone, was then lapped down by physical abrasion to a width of 0.2 mil. This was considerably less than the diffusion length of holes in that zone, which was of the order of a few mils. The diffusion length for a given type of semiconductor at a given temperature and resistivity is substantially fixed and may be readily ascertained. The structure was then etched to remove surface impurities. Note that this manufacturing procedure differs from that employed in transistor production only by the addition of a simple lapping operation. This makes for great manufacturing economy, since virtually the same production line can turn out either transistors or diodes. It should also be noted that both of the junctions in applicants' diode will be substantially congruent in size and shape, so that carriers injected across emitter junction 29 from emitter zone 23 must all cross base zone 25 in order to reach the collector junction 31. Preferably, the various zones should all be of uniform and equal cross-section.

*Diode Operation*

Figure 3A:
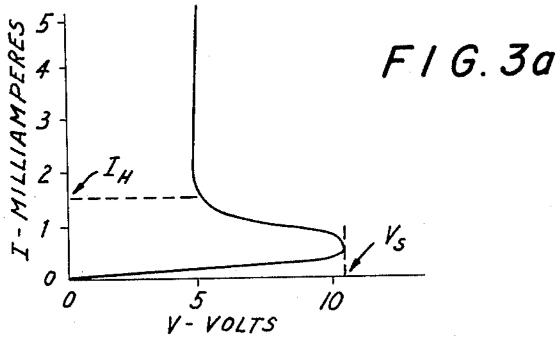
FIGS. 3*a* and 3*b* are curves respectively depicting two varieties of operating characteristics which may be obtained with the diode of FIG. 2, depending on the resistivities and widths of the various semiconductive zones thereof.
Figure 3B:
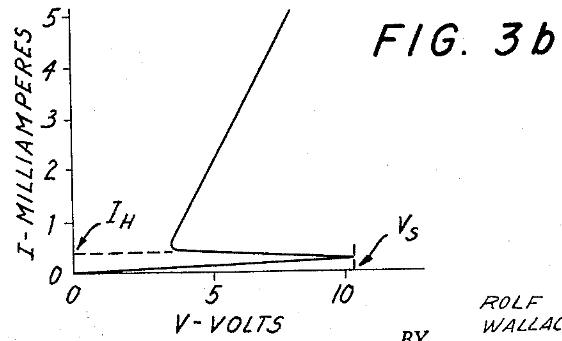

The operating characteristic of the novel diode shown in FIG. 2 will be of the general shape shown by either of the curves of FIGS. 3*a* and 3*b*, the former representing a "soft" switching characteristic and the latter a "sharp" switching characteristic. In either case, the current remains very low and increases relatively little as the voltage V applied across the diode increases to the switching level $V_s$. This level may be set as desired over a range from a few volts to over 50 volts by controlling the width of the collector zone 27, a narrower width yielding lower values of $V_s$. A higher resistivity of the collector zone will also cause a reduced $V_s$, since the barrier region will then encompass the entire zone at a lower voltage level. The numerical values shown on the current in FIGS. 3*a* and 3*b* indicate results obtained with the particular diode construction noted above, but may differ considerably with other modes of construction as described herein.

Once the switching voltage is atttained, the operating characteristic undergoes a radical change from the previous high resistance state by traversing an unstable region wherein the voltage across the diode drops over a considerable range while the current conducted thereby rises to a level denoted the holding current $I_H$. In this region, therefore, the diode exhibits a negative resistance. The curve of FIG. 3*b* displays this to a more pronounced degree than that of FIG. 3*a*, a relatively small rise in current in FIG. 3*b* accounting for the entire transition in voltage. This behaviour is attributable to base zone 25 having a higher resistivity than in the case of FIG. 3*a*, so that a smaller increase in minority carrier concentration in that zone suffices to produce the same reduction in the potential across the barrier region at collector junction 31. The shape of the operating characteristic is also affected by the degree to which the diode is etched in manufacture, a greater degree of etching resulting in more complete removal of surface impurities and so in an effectively higher junction resistance.

When the current reaches the holding level $I_H$ the diode will behave as a forward-biased PN junction. Its resistance will then be purely ohmic, and so will have fallen to a very much lower value. Since in both the high and low resistance states the direction of current flow through the diode is the same, the described operating characteristic is for the forward direction.

The behaviour of the diode of FIG. 2 may be analyzed with reference to the injection efficiency $\gamma$ of emitter junction 29 and the transport efficiency $\beta$ of base zone 25 for minority holes injected therein by the emitter junction. The injection efficiency is the proportion of the total current crossing the emitter junction which is carried by holes from the emitter zone, or $$\gamma=\frac{I_p}{I_p+I_n}=\frac{1}{1+\frac{I_n}{I_p}} \qquad (2)$$

where $I_p$ is the hole current from emitter zone 23 and $I_n$ is the electron current from base zone 25, and so to the resistivity $\rho_n$ of that zone. It is also inversely proportional to the diffusion length $L_p$ of holes in the N type base zone. The same considerations apply to the current $I_n$ with respect to the resistivity $\rho_p$ of the P type emitter zone 23 and the diffusion lengh $L_n$ of elecrons therein. Equation 2 may therefore be expressed as $$\gamma=\frac{1}{1+\frac{\rho_p L_p}{\rho_n L_n}} \qquad (3)$$

This enables design of the diode to obtain a desired value of $\gamma$ by controlling the relative impurity content or "doping" of the emitter and base zones in accordance with the required resistivity ratio.

The transport efficiency $\beta$ is the ratio of the minority hole current crossing the collector junction to that crossing the emitter junction, and so depends on the degree to which holes entering the base zone recombine with electrons therein. Virtually all holes crossing collector junction 31 will be drawn to ohmic collector contact **35*c*, which serves as a sink for holes. Consequently, the current gain factor $\alpha$ of the diode, exclusive of the avalanche current multiplication at collector junction 31, will be given by the product $\beta\gamma.\beta\gamma$ represents the fraction of the total input current at emitter contact 35*e* which reaches collector contact 35*c***. The total current thereat will be further augmented by the saturation current $I_{co}$. Since the total current must equal the total input current, $$I=\alpha I+I_{co} \qquad (4)$$

where I is the observed current through the diode.

The foregoing relation (4) must actually be modified to take account of the avalanche current multiplication factor M applicable to the reverse-biased collector junction 31. This causes the output current at collector terminal **35*c*** to be M times the value otherwise obtained, so that Equation 4 becomes $$I=M\alpha I+MI_{co}$$

or $$I=\frac{I_{co}}{1/M-\alpha} \qquad (5)$$

Equation 5 shows that instability will occur as M approaches unity. That quantity may be regarded as the total current gain $M_T$, and from Equation 1 will be given by $$M_T=\frac{\alpha}{1-(V/V_B)^n} \qquad (6)$$

The overall voltage-current characteristics of the diode may be obtained by combining Equations 1 and 5, yielding $$V=V_B\sqrt[n]{1-\alpha-\frac{I_{co}}{I}} \qquad (7)$$

This indicates that the voltage drop V across the diode will be reduced or the current I increases if the current gain factor $\alpha$ increases at a proportionate rate exceeding the proportionate rate of increase in current.

The mechanism whereby the requisite rise in $\alpha$ is obtained may be perceived by considering the sequence of events within diode structure 21 as the applied voltage is increased. Proir to the switching level $V_S$ the potential barrier region **33*a*—33*b* will increase in width just as in the case of the simple reverse-biased PN junction in FIG. 1. Assuming a higher resistivity in collector zone 27 than in base zone 25, most of that increase will occur by penetration into the collector zone. During this interval the small current through the diode will principally be due to the avalanche multiplication factor M, which may appreciably exceed unity, while the current gain factor $\alpha$ will be very low. When the voltage reaches the switching level $V_S$ the potential barrier region will extend completely across collector zone 27. At that point any further infinitesimal increment in voltage will tend to exceed the potential which the barrier region can support, inasmuch as no further increase in the latter can be obtained. This excess voltage therefore appears across both the emitter junction 29 and the base zone 25, and causes the current conducted through the diode to increase. The current multiplication factor M cannot increase because of its dependence on the barrier potential, so that the only way in which additional carriers to support the increased current at the collector junction can be obtained is by increased conduction of holes from base zone 25. This, in turn, requires increased injection of holes across emitter junction 23 into the base zone, producing a rise in the current gain factor $\alpha$. In accordance with Equation 7, stability tends to be established when $\alpha$ rises by just enough to reduce the voltage V to a level which can be supported by the barrier potential at collector junction 31. However, the increase in hole current through base zone 25 also raises the equilibrium concentration of holes therein. This effect is accentuated in the case of silicon semiconductors because of a characteristic tendency thereof to trap carriers for appreciable intervals of their passage. The increased hole concentration in the base zone 25, wherein they are minority carriers, has the effect of partially neutralizing the charge due to electrons therein and so requires a reduction in the width and potential across the potential barrier region at collector junction 31. This occurs while the voltage across the diode is dropping to a level which the barrier potential could formerly support. It is therefore clear that $\alpha$ will continue to rise and that a regenerative collapse in the barrier potential and the voltage across diode structure 21 will take place due to a regenerative increase in the concentration of minority holes injected within the base zone 25 by emitter junction 29. This process will also be accompanied by some increase in current, but not nearly as extensive as the fall in voltage due to the fact that a relatively small increase in minority carrier concentration in the base zone produces a large drop in barrier potential. The regenerative switching operation necessarily terminates when the concentration of holes in base zone 25 tends to exceed the electron concentration therein, since collector junction 31** will then effectively be forward-biased and the barrier potential will be zero. The diode will then be in its low resistance state, its resistance having regeneratively dropped thereto during the regenerative switching operation.

If base zone 25 is of high resistivity material the switching operation will be accentuated, since a larger change in barrier potential will be obtained for a given current increment. For a given base zone resistivity an increase in the width of that zone will reduce the hole current transport efficiency $\beta$, thus tending to produce a more gradual switching characteristic such as that shown in FIG. 3*a*. A reduction in the resistivity of emitter zone 23 will accentuate the switching operation, since a greater increase in hole concentration in the emitter junction will be obtained for a given increment in current. All these physical factors can therefore be controlled to produce a desired shape of the operating characteristic of the diode.

While the invention has been described with reference to a PNP zone structure, and NPN structure would obviously be equally suitable. In addition, although the avalanche current multiplication and charge trapping effects are more prominent in silicon than in germanium semiconductors, the principles of the invention are equally applicable to a diode composed of germanium. More generally, any type of material exhibiting semiconductor behaviour of the kind described may be employed. It should also be noted that while a physical theory for the operation of applicants' diode has been presented this may be subject to modification in light of future advances in the understanding of semiconductor behaviour. The true spirit and scope of the invention is therefore actually as set forth in the ensuing claims.

We claim:

1. A semiconductor diode comprising: a unitary structure of three successive semiconductive zones being congruent in size and shape which form an emitter junction between the first outer zone and one side of the central zone and a collector junction between the second outer zone and the other side of the central zone, the width of said second outer zone being at most equal to the diffusion length therein of minority carriers from said central zone; and means for applying a voltage across said structure which forward-biases said emitter junction and reverse-biases said collector junction so as to establish thereat a potential barrier region which extends completely across said second outer zone when said voltage reaches a predetermined switching level, the potential across said barrier region then regeneratively collapsing due to a regenerative increase in the concentration of minority carriers injected into said central zone by said emitter junction.

2. A semiconductor diode comprising: a unitary structure of three successive semiconductive zones being congruent in size and shape which form an emitter junction between the first outer zone and one side of the central zone and a collector junction between the second outer zone and the other side of the central zone, the width of said second outer zone being at most equal to the diffusion length therein of minority carriers from said central zone; and means for applying a voltage across said structure which forward-biases said emitter junction and reverse-biases said collector junction so as to establish thereat a potential barrier region which extends completely across said second outer zone when said voltage reaches a predetermined switching level which is reduced for narrower widths of that zone, the potential across said barrier region then regeneratively collapsing due to a regenerative increase in the concentration of minority carriers injected into said central zone by said emitter junction.

3. A semiconductor diode comprising: a unitary structure of three successive semiconductive zones being congruent in size and shape which form an emitter junction between the first outer zone and one side of the central zone and a collector junction between the second outer zone and the other side of the central zone, the width of said second outer zone being at most equal to the diffusion length therein of minority carriers from said central zone; and means for applying a voltage across said structure which forward-biases said emitter junction and reverse-biases said collector junction so as to establish thereat a potential barrier region which maintains the resistance of said structure relatively high until said voltage reaches a predetermined switching elevel at which the barrier region extends completely across said second outer zone, the potential across said barrier region and the resistance of said structure then regeneratively falling to a low level due to a regenerative increase in the concentration of minority carriers injected into said central zone by said emitter junction.

4. A semiconductor diode comprising: a unitary assembly of successive emitter, base and collector semiconductive zones of successively alternate type conductivity, the junction between said emitter and base zones and that between said collector and base zones being substantially congruent in shape and area, and the width of said collector zone being less than that of either of the remaining zones and at most equal to the diffusion length in the collector zone of minority carriers from said base zone; and means including ohmic contacts extending over the entire area to said emitter and collector zones for applying a voltage there-across which forward-biases the junction between said emitter and base zones and reverse-biases that between said collector and base zones so as to establish at the latter junction a potential barrier region which maintains the resistance of said structure relatively high until said voltage reaches a predetermined switching level at which the barrier region extends completely across said collector zone, the potential across said barrier region and the resistance of said structure then regeneratively falling to a low level due to a regenerative increase in the concentration of minority carriers injected into said base zone from said emitter zone.

5. A semiconductor junction diode comprising: a semiconductor wafer containing a relatively wide central zone of one type conductivity, a diffused zone of the opposite type conductivity at one end thereof, and a narrower second diffused zone of said opposite type conductivity at the other end thereof, the width of said narrower diffused zone being at most equal to the diffusion length therein of minority carriers from said central zone; and means including a pair of ohmic contacts extending over the entire area to the ends of said wafer for applying a voltage there-across which forward-biases the junction between said first diffused zone and said central zone and reverse-biases that between said second diffused zone and said central zone so as to establish at the latter junction a potential barrier region which extends completely across said second diffused zone when said voltage reaches a predetermined switching level which is reduced for narrower widths of that zone, the potential across said barrier region and the resistance of said wafer then regeneratively falling to a low level due to a regenerative increase in the concentration of minority carriers injected into said central zone from said first diffused zone.

6. The semiconductor junction diode of claim 5, wherein said wafer is composed of silicon.

7. The semiconductor junction diode of claim 5, wherein said wafer is composed of silicon, said central zone is of the order of 14 mils wide and of N type conductivity having a resistivity of the order of 40 ohm-centimeters, said first diffused zone is of the order of 2 mils wide and of P type conductivity, and second diffused zone is of the order of 0.2 mils wide and of P type conductivity.

References Cited in the file of this patent

UNITED STATES PATENTS

| | | |
|---|---|---|
| 2,772,360 | Shockley | Nov. 27, 1956 |
| 2,794,917 | Shockley | June 4, 1957 |
| 2,852,677 | Shockley | Sept. 16, 1958 |
| 2,862,115 | Ross | Nov. 25, 1958 |
| 2,915,647 | Ebers et al. | Dec. 1, 1959 |